(12) United States Patent
Xu et al.

(10) Patent No.: US 10,325,935 B2
(45) Date of Patent: Jun. 18, 2019

(54) DISPLAY PANEL, PRODUCTION METHOD OF THE SAME, AND DISPLAY APPARATUS

(71) Applicants: BOE Technology Group Co., Ltd., Beijing (CN); Hefei BOE Optoelectronics Technology Co., Ltd., Anhui (CN)

(72) Inventors: Dezhi Xu, Beijing (CN); Kui Gong, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/034,429

(22) Filed: Jul. 13, 2018

(65) Prior Publication Data
US 2019/0067331 A1    Feb. 28, 2019

(30) Foreign Application Priority Data
Aug. 30, 2017   (CN) .......................... 2017 1 0765411

(51) Int. Cl.
H01L 27/12    (2006.01)
H01L 33/42    (2010.01)
H01L 33/00    (2010.01)

(52) U.S. Cl.
CPC ........ H01L 27/124 (2013.01); H01L 27/1259 (2013.01); H01L 33/005 (2013.01); H01L 33/42 (2013.01)

(58) Field of Classification Search
CPC ............. H01L 27/1259; H01L 27/3248; H01L 27/3276; H01L 27/3279; H01L 27/3297; H01L 33/005; H01L 33/42; H01L 27/124; G02F 1/1362–1/1368; G02F 1/136286; G02F 2001/13629; G02F 2001/136295
See application file for complete search history.

(56) References Cited

U.S. PATENT DOCUMENTS

| | | | |
|---|---|---|---|
| 2003/0153110 A1* | 8/2003 | Hotta | H01L 27/12 438/30 |
| 2019/0067337 A1* | 2/2019 | Gong | H01L 27/1259 |

* cited by examiner

*Primary Examiner* — Matthew C Landau
*Assistant Examiner* — Mark Hatzilambrou
(74) *Attorney, Agent, or Firm* — Westman, Champlin & Koehler, P.A.

(57) ABSTRACT

This disclosure discloses a display panel, a production method thereof, and a display apparatus. This method comprises: forming a pattern of a first metal layer on a base substrate and a pattern of a metal oxide conductive layer being electrically connected to the first metal layer by at least one through hole at a side of the first metal layer away from the base substrate; forming a reductive metal compound layer on a surface of the first metal layer at a side away from the base substrate before forming the pattern of the metal oxide conductive layer; treating the reductive metal compound layer and the metal oxide conductive layer after forming the pattern of the metal oxide conductive layer so that the reductive metal compound layer is oxidized into a second metal layer and metal particles are produced at the surface of the metal oxide conductive layer.

18 Claims, 7 Drawing Sheets

DISPLAY PANEL, PRODUCTION METHOD OF THE SAME, AND DISPLAY APPARATUS

CROSS-REFERENCE TO RELATED APPLICATION

This application claims the benefit of priority of Chinese Application No. 201710765411.3 filed on Aug. 30, 2017, the entire contents of which are hereby incorporated by reference.

TECHNICAL FIELD

This disclosure relates to the technical field of display, and in particular to a display panel, a production method thereof, and a display apparatus.

BACKGROUND ART

Liquid crystal displays (LCDs) have the advantages of thin body, saving electricity, no radiation, and the like, and have been widely used. An existing liquid crystal display apparatus comprises a liquid crystal display panel and a backlight module (BM). Generally, a liquid crystal display panel comprises a color filter (CF) substrate, an array (thin film transistor, TFT) substrate, and a liquid crystal layer provided between the color filter substrate and the array substrate. Liquid crystal molecules are controlled to change direction by whether the array substrate is supplied with a power, and light beams of the backlight module are projected on the color filter substrate to generate an image desirable to be displayed.

SUMMARY

Embodiments of this disclosure provide a display panel, a production method thereof, and a display apparatus.

In a first aspect, an embodiment of this disclosure provides a production method of a display panel, comprising:
  forming a pattern of a first metal layer on a base substrate and a pattern of a metal oxide conductive layer at a side of the first metal layer away from the base substrate, the metal oxide conductive layer being electrically connected to the first metal layer by at least one through hole; wherein
  the production method further comprises steps of
  forming a reductive metal compound layer on a surface of the first metal layer at the side away from the base substrate before forming the pattern of the metal oxide conductive layer; and
  treating the reductive metal compound layer and the metal oxide conductive layer after forming the pattern of the metal oxide conductive layer, so that the reductive metal compound layer is oxidized into a second metal layer and metal particles are produced at a surface of the metal oxide conductive layer at a side adjacent to the base substrate by reduction.

In one possible implementation, in the above production method provided in embodiments of this disclosure, said forming a reductive metal compound layer on a surface of the first metal layer at a side away from the base substrate comprises: forming a reductive metal compound layer on a surface of the first metal layer at a side away from the base substrate by a reaction between a solution of a metal salt and a reducing agent.

In one possible implementation, in the above production method provided in embodiments of this disclosure, said forming a reductive metal compound layer on a surface of the first metal layer at a side away from the base substrate comprises: performing plasma treatment using a reductive gas on the surface of the first metal layer at the side away from the base substrate.

In one possible implementation, in the above production method provided in embodiments of this disclosure, the reductive metal compound layer is a metal hydride layer.

In one possible implementation, in the above production method provided in embodiments of this disclosure, the reductive metal compound layer is a copper hydride layer.

In one possible implementation, in the above production method provided in embodiments of this disclosure, the reductive metal compound layer has a thickness of 10 nm to 20 nm.

In one possible implementation, in the above production method provided in embodiments of this disclosure, the copper hydride layer is formed by a reaction between a copper salt and a reducing agent.

In one possible implementation, in the above production method provided in embodiments of this disclosure, a metal material used in the first metal layer is the same as a metal material used in the second metal layer.

In one possible implementation, in the above production method provided in embodiments of this disclosure, said performing plasma treatment using a reductive gas on the surface of the first metal layer at a side away from the base substrate comprises: performing plasma treatment using one or more gases selected from $H_2$, $NH_3$, $N_2H_4$, $H_2S$, $CH_4$, $C_2H_6$ or HCN on the surface of the first metal layer at a side away from the base substrate.

In one possible implementation, in the above production method provided in embodiments of this disclosure, said treating the reductive metal compound layer and the metal oxide conductive layer so that the reductive metal compound layer is oxidized into a second metal layer and metal particles are produced at the surface of the metal oxide conductive layer at the side adjacent to the base substrate by reduction comprises: heating the base substrate after forming the pattern of the metal oxide conductive layer.

In one possible implementation, in the above production method provided in embodiments of this disclosure, the base substrate after forming the pattern of the metal oxide conductive layer is heated to 60° C. to 100° C.

In one possible implementation, in the above production method provided in embodiments of this disclosure, before said forming a pattern of a first metal layer on a base substrate, the production method further comprises forming a barrier metal layer on the base substrate.

In one possible implementation, in the above production method provided in embodiments of this disclosure, said forming a reductive metal compound layer on a surface of the first metal layer at a side away from the base substrate before forming the pattern of the metal oxide conductive layer comprises:
  forming a reductive metal compound layer on a surface of the first metal layer at a side away from the base substrate after forming the first metal layer and before forming the pattern of the first metal layer; or
  forming a reductive metal compound layer on a surface of the first metal layer at a side away from the base substrate after forming the pattern of the first metal layer and before forming the through hole conducting the first metal layer and the metal oxide conductive layer; or
  forming a reductive metal compound layer on a surface of the first metal layer at a side away from the base substrate after forming the through hole conducting the first metal layer and the metal oxide conductive layer and before forming the pattern of the metal oxide conductive layer.

In one possible implementation, in the above production method provided in embodiments of this disclosure, the first metal layer is a copper layer or an aluminum layer.

In one possible implementation, in the above production method provided in embodiments of this disclosure, the metal oxide conductive layer is an indium tin oxide layer.

In one possible implementation, in the above production method provided in embodiments of this disclosure, the metal oxide conductive layer has a thickness of 40 nm to 100 nm.

In one possible implementation, in the above production method provided in embodiments of this disclosure, a material of the barrier metal layer is selected from Mo, a MoNb alloy, Ti, or a MoTi alloy.

In one possible implementation, in the above production method provided in embodiments of this disclosure, the barrier metal layer has a thickness of 20 nm to 50 nm.

In a second aspect, an embodiment of this disclosure provides a display panel, which is produced by the production method of the display panel described above.

In a third aspect, an embodiment of this disclosure provides a display apparatus, comprising: the display panel described above.

DESCRIPTION OF EMBODIMENTS

According to this disclosure, the expressions of "on" and "located on" not only comprise the case that a second layer is on a first layer in a direct contact manner, but also comprise the case that a second layer is on a first layer in a non-contact manner, wherein there may also be a further one-layer or multi-layer configuration between the first layer and the second layer.

The property characteristics and operation properties of an array substrate of a liquid crystal display partly or largely depend on the materials forming various elements of the array substrate. Metal leads in an array substrate are produced by an etching process of a metal layer sputtered on the array substrate. Metal leads conventionally used in an array substrate are aluminum leads. With the development trends and requirements of large size, high resolution, and high speed of driving frequency of liquid crystal display terminals such as televisions, the persons skilled in the art of liquid crystal display have to face to the problems of resistance and resultant resistance/capacitance delay in array substrates. Aluminum leads have a relatively high resistivity (approximately 4 μΩ·cm) so that pixel electrodes of array substrates cannot be sufficiently charged. As high-frequency (>120 Hz) liquid crystal display has been widely used, this phenomenon is more remarkable. Compared to aluminum leads, copper leads have a relatively low resistivity (approximately 2 μΩ·cm) and a good anti-electromigration capability, and thus are used in array substrates to solve the above problems caused by aluminum leads.

However, when a copper metal thin film is exposed in air or is in contact with some film layers having oxidizing properties, the problem of oxidation will easily occur. If the surface of copper is oxidized, deterioration and peeling of a copper metal film layer will be caused. This will certainly impact the transmission and conduction of current signals. In a via hole structure, for example, the bridge joint between a common electrode and another film layer is accomplished by a transparent conductive oxide material. If a metal oxide conductive layer is in contact with copper, severe oxidation of a copper film layer on the contact interface will usually occur, resulting in an excessively high interface contact resistance, which leads to the occurrence of the problem of contact defect, impacts the normal operation of thin-film transistors, and generates mis-functionalities of display devices.

Therefore, how to solve the problem that metal layers will be easily oxidized is a technical problem urgent to be solved.

With respect to the problem that the metal layer will be easily oxidized, embodiments of this disclosure provide a display panel, a production method thereof, and a display apparatus.

Specific embodiments of the display panel, the production method thereof, and the display apparatus provided in embodiments of this disclosure will be illustrated in detail below in conjunction with accompanying drawings. The thicknesses and shapes of various film layers in the accompanying drawings do not reflect real ratios, and the object thereof is merely to exemplarily illustrate this disclosure.

In a first aspect, an embodiment of this disclosure provides a production method of a display panel, comprising:
  forming a pattern of a first metal layer on a base substrate and a pattern of a metal oxide conductive layer at a side of the first metal layer away from the base substrate, the metal oxide conductive layer being electrically connected to the first metal layer by at least one through hole; wherein
  S100, forming a reductive metal compound layer on a surface of the first metal layer at a side away from the base substrate before forming the pattern of the metal oxide conductive layer; and
  S105, treating the reductive metal compound layer and the metal oxide conductive layer after forming the pattern of the metal oxide conductive layer so that the reductive metal compound layer is oxidized into a second metal layer and metal particles are produced at the surface of the metal oxide conductive layer at a side adjacent to the base substrate by reduction.

In the production method provided in embodiments of this disclosure, by forming a reductive metal compound layer on a surface of the first metal layer at a side away from the base substrate before forming the metal oxide conductive layer, the oxidation of the first metal layer caused by being in contact with the metal oxide conductive layer may be thus prevented. Additionally, the reductive metal compound layer and the metal oxide conductive layer are treated after forming the pattern of the metal oxide conductive layer so that there is a second metal layer and metal particles from the metal oxide conductive layer by reduction between the first metal layer and the metal oxide conductive layer. Therefore, the contact resistance between the first metal layer and the metal oxide conductive layer may be greatly reduced so as to improve the display effect.

Figure 1:
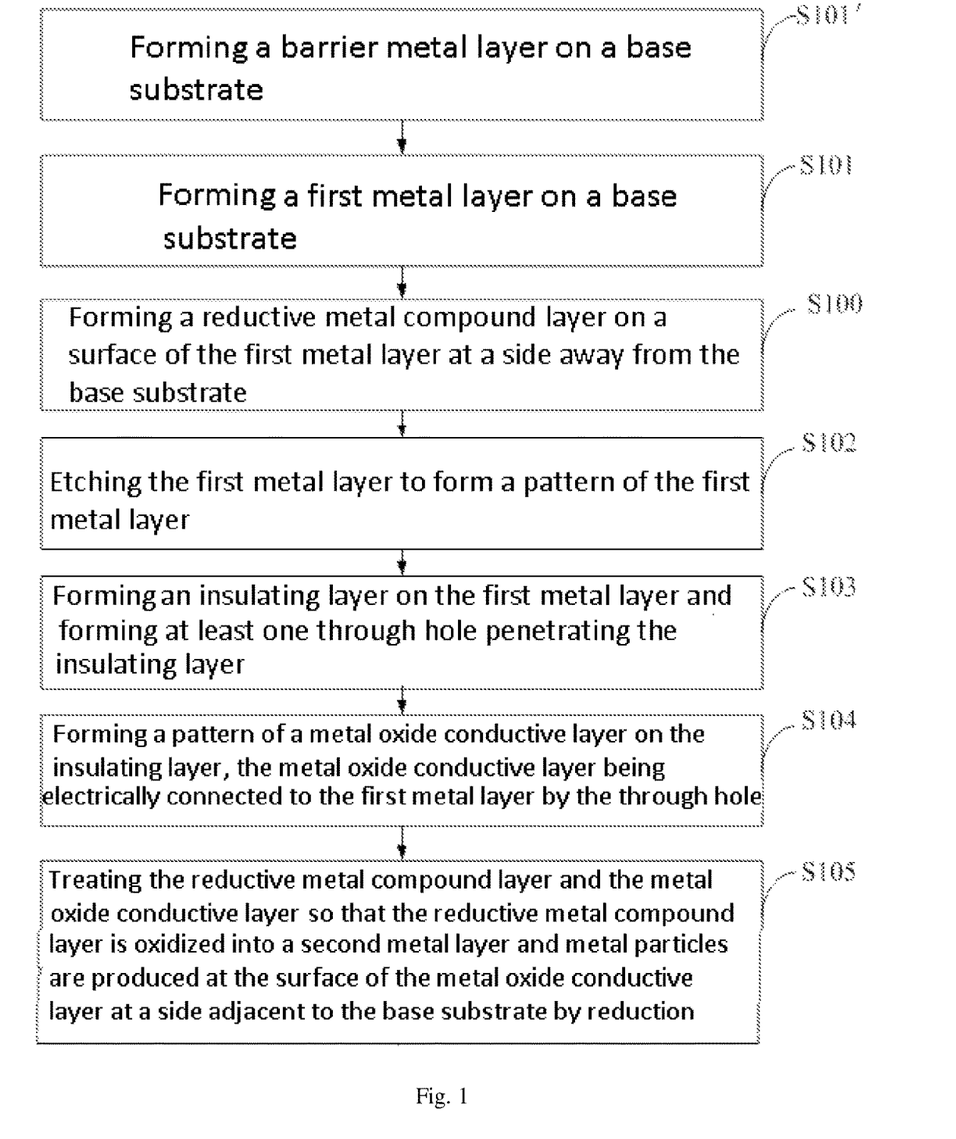
FIG. 1 is a first flow chart of a production method of a display panel provided in an embodiment of this disclosure.
Figure 2:
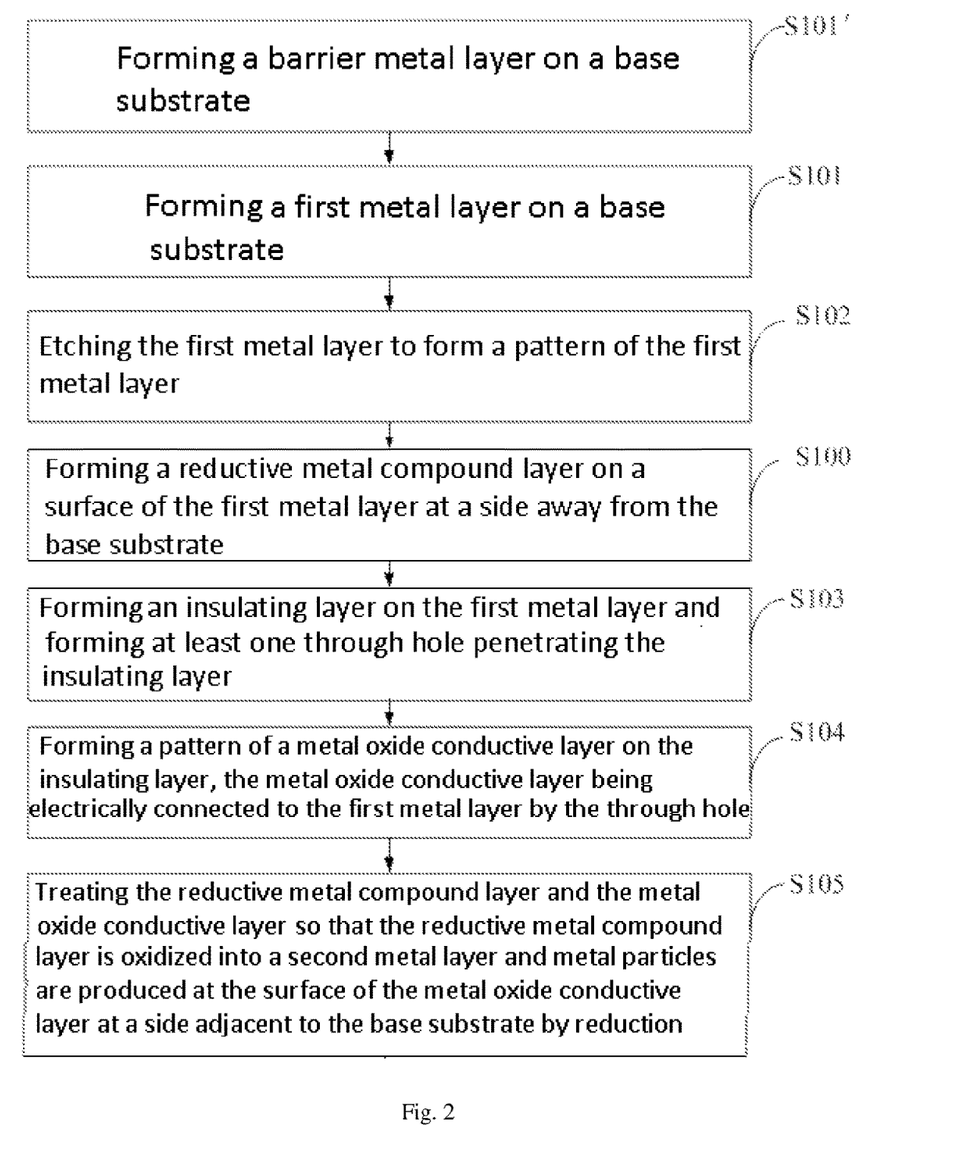
FIG. 2 is a second flow chart of a production method of a display panel provided in an embodiment of this disclosure.
Figure 3:
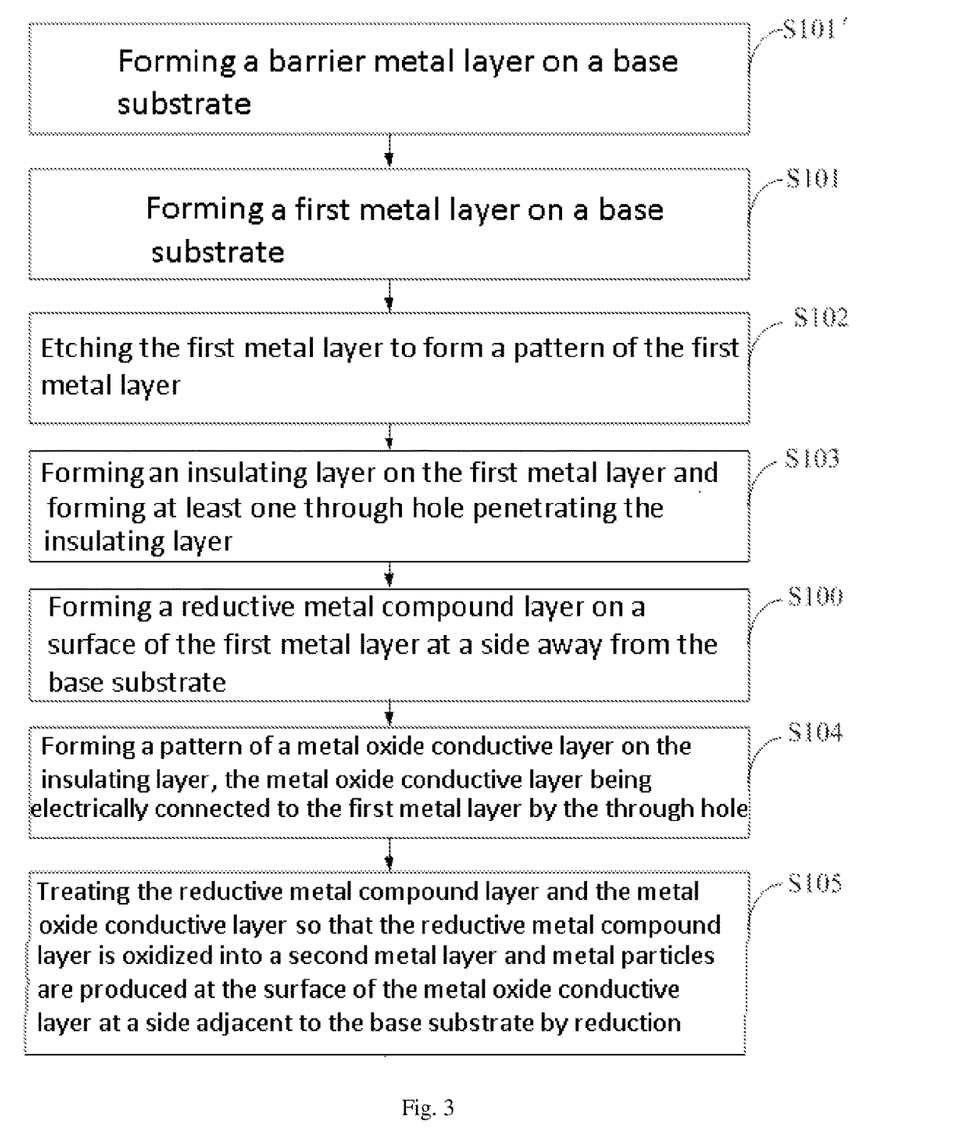
FIG. 3 is a third flow chart of a production method of a display panel provided in an embodiment of this disclosure.

Specifically, as shown in FIG. 1 to FIG. 3, said forming a pattern of a first metal layer on a base substrate and a pattern of a metal oxide conductive layer at a side of the first metal layer away from the base substrate, the metal oxide conductive layer being electrically connected to the first metal layer by at least one through hole, may comprise the steps of:

S101, forming a first metal layer on a base substrate;

S102, etching the first metal layer to form a pattern of the first metal layer;

S103, forming an insulating layer on the first metal layer and forming at least one through hole penetrating the insulating layer; and S104, forming a pattern of a metal oxide conductive layer on the insulating layer, the metal oxide conductive layer being electrically connected to the first metal layer by the through hole.

Figure 4A:
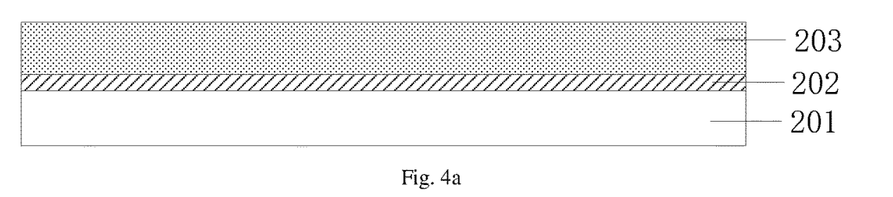
FIG. 4a to FIG. 4f, FIG. 5, and FIG. 6a to FIG. 6d are structural schematic diagrams in the production process of the display panel provided in embodiments of this disclosure.

In a specific practice, in Step S101 described above, a first metal layer 203 is formed on a base substrate 201. As shown in FIG. 4a, the thickness of the first metal layer 203 is preferably 200 nm to 400 nm. The material of the first metal layer 203 is preferably a metal such as copper (Cu), aluminum (Al), or the like, or may be other metals. The material of the first metal layer 203 is not limited at this time.

In Step S103 described above, an insulating layer 205 is formed on the pattern of the first metal layer 203. As shown in FIG. 4d, the insulating layer 205 has a through hole 209. The layer number of the insulating layer 205 may be determined according to practical needs, and for example, may be set to be one layer, two layers, or more layers. Illustrations are made by exemplifying one insulating layer 205 in all accompanying drawings of embodiments of this disclosure. The layer number of the insulating layer 205 is not limited. When there are a plurality of through holes, the through holes penetrating various insulating layers 205 may be formed by a one-time patterning process. The processes of coating and patterning of the insulating layer 205 preferably employ low-temperature process. The range of temperature is preferably controlled at 40° C. to 50° C. to prevent impacting other film layers due to excessively high temperature. The material of the insulating layer 205 may be an inorganic material, for example a nitride thin film of $Si_3N_4$, AlN, or the like, and is preferably a $Si_3N_4$ thin film. An organic material, for example polymethyl methacrylate (PMMA), may also be used. Additionally, the organic materials having photosensing properties may also be employed, and may be positive or negative organic materials. In this way, photolithography may be directly performed on the insulating layer 205 to obtain a pattern of the insulating layer 205 and the process of etching the insulating layer 205 is omitted, and the process cost may be saved. The material of the insulating layer 205 is illustrated by way of example only, and the material of the insulating layer 205 is not limited.

In Step S104 described above, the metal oxide conductive layer 206 may be formed by using a magnetron sputtering method. As shown in FIG. 4e, the thickness of the metal oxide conductive layer 206 is preferably 40 nm to 100 nm, and the material of the metal oxide conductive layer 206 is preferably a transparent material, for example indium tin oxide (ITO) and other materials may also be used. The material of the metal oxide conductive layer 206 is not limited. This metal oxide conductive material may be used as a common electrode layer or a pixel electrode layer. A pattern of a common electrode layer or a pattern of a pixel electrode layer may be formed by a one-time patterning process.

Specifically, in the production method of the display panel described above provided in embodiments of this disclosure, the Step S100 described above may be achieved in the following two methods:

Method One:

Forming a reductive metal compound layer on a surface of the first metal layer at a side away from the base substrate by a reaction between a solution of a metal salt and a reducing agent.

In practical use, any material having reducibility may be used as the reducing agent described above. The above solution of a metal salt refers to a solution comprising a metal salt corresponding to the metal in the reductive metal compound layer. The reductive metal compound layer is formed on the surface of the first metal layer by using a solution method. In this way, different metal materials used in the reductive metal compound layer and the first metal layer may be achieved. For example, the first metal layer may be a metal having a poorer conductive property. By forming a reductive metal compound layer having a better conductive property on the surface of the first metal layer and subsequently treating the reductive metal compound layer, a second metal layer having a better conductive property is formed on the surface of the first metal layer, such that the contact resistance between the first metal layer and the metal oxide conductive layer may be reduced. Therefore, the signal transmission rate is increased and the display effect is improved.

Specifically, the material of the reductive metal compound layer described above is preferably a metal hydride.

The process of performing a reaction between a reducing agent and an aqueous solution comprising a metal salt corresponding to the metal in the reductive metal compound layer under a set condition may comprise:

mixing a reducing agent and an aqueous solution comprising a metal salt corresponding to the metal in the reductive metal compound layer, and performing reaction under conditions of an acidic environment and a temperature of 40° C. to 50° C.

The metal hydride is decomposed into a metal and hydrogen very easily under a certain condition due to its active chemical properties. The metal formed may prevent the first metal layer from being oxidized and may also reduce the contact resistance with the metal oxide conductive layer, and the hydrogen formed may allow the metal in the metal oxide conductive layer to be withdrawn by reduction and the contact resistance between the first metal layer and the metal oxide conductive layer may be further reduced.

For example, the metal hydride described above may be CuH. CuH may be produced by using the following steps:

(1) A copper compound is dissolved in water to form an aqueous solution of a copper salt, for example, to form an aqueous solution of a compound of copper sulfate;

(2) An acid, which may be formic acid, acetic acid, hypophosphorous acid, or the like, and is preferably hypophosphorous acid, is added to the aqueous solution of the copper salt described above, and the pH of the solution is preferably adjusted to be 3 or less in order to obtain a better reaction effect;

(3) The above solution is added with a reducing agent and the reaction temperature is controlled to be 40° C. to 50° C.

The preparation equation of CuH is:

In the process of preparation, steps (1), (2), and (3) described above may be performed simultaneously or may be performed sequentially. The order of steps (1), (2), and (3) described above is not limited. In a specific practice, the thickness of the reductive metal compound layer described above is preferably 10 nm to 20 nm, and the thickness of the reductive metal compound layer formed may be controlled by controlling the reaction time.

Method Two: the metal materials used in the first metal layer and the second metal layer are the same;

Step S100 described above may comprise:
  performing plasma treatment on the surface of the first metal layer at the side away from the base substrate using a reductive gas.

A base substrate having a first metal layer is subject to surface treatment in a plasma atmosphere. This plasma atmosphere has reducibility to form a reductive metal compound layer on the surface of the first metal layer, such that the first metal layer may be prevented from being oxidized. The metal atoms in the reductive metal compound layer formed by using a plasma method are the same as the metal atoms on the surface of the first metal layer. This plasma excites one or more reductive gases to form a reductive plasma. Specifically, the temperature range of the plasma is preferably 50° C. to 60° C. The time of surface treatment with plasma may be adjusted in a range of 30 to 80 sec according to the degree of the surface treatment, and the pressure of a plasma chamber may be controlled to be 100 Pa to 200 Pa.

Specifically, the above-mentioned performing plasma treatment on the surface of the first metal layer at the side away from the base substrate using a reductive gas may specifically comprise:
  performing plasma treatment on the surface of the first metal layer at the side away from the base substrate using one or more gases of $H_2$, $NH_3$, $N_2H_4$, $H_2S$, $CH_4$, $C_2H_6$ or HCN.

Furthermore, in the production method of the display panel described above provided in embodiments of this disclosure, the material of the reductive metal compound layer is a metal hydride.

Step S105 described above may comprise:
  heating the base substrate after forming the pattern of the metal oxide conductive layer to 60° C. to 100° C.

A metal hydride is present in a state in which a metal atom is bonded to a hydrogen atom, and has a property of being decomposed into a metal and hydrogen at a certain temperature. Therefore, heating may be performed after the pattern of the metal oxide conductive layer is formed, such that the reductive metal compound layer is oxidized into a second metal layer and metal particles are produced at the surface of the metal oxide conductive layer at a side adjacent to the second metal, as shown in FIG. 4f. The conductive property is improved and the contact resistance is reduced. In a specific practice, when the number of metal particles produced by reduction is relatively large, a conductive metal layer may be formed.

As an example, the first metal layer is a copper metal layer, the material of the reductive metal compound layer is CuH, and the metal oxide conductive layer is an ITO layer. The base substrate after forming the ITO layer is heated to 60° C. to 100° C. in air for preferably 1 min to 2 min, and CuH may be decomposed into Cu and $H_2$. At the contact interface with the ITO layer, $In_2O_3$ may be reduced into metal indium by $H_2$ and an indium ball layer may be formed when the number of metal particles is large, while the reductive metal compound layer is oxidized into the second metal layer. When the materials used in the first metal layer and the second metal layer are the same, the first metal layer and second metal are laminated into the same metal layer.

In practical use, in the production method of the display panel described above provided in embodiments of this disclosure, before Step S101 described above, as shown in FIGS. 1 to 3 and FIG. 4a, it may further comprise:
  S101', forming a barrier metal layer 202 on a base substrate 201.

By forming the barrier metal layer 202 on the base substrate 201, after the first metal layer 203 is formed subsequently, the barrier metal layer 202 located between the first metal layer 203 and the base substrate 201 may increase the adhesion between the first metal layer 203 and a pad substrate and may also block the diffusion of metal atoms in the first metal layer 203 to the base substrate 201. The material of the barrier metal layer 202 described above may be Mo, a MoNb alloy, Ti, or a MoTi alloy, and is preferably a MoNb alloy. The thickness of the barrier metal layer 202 is preferably 20 nm to 50 nm. These are merely illustrations by way of example here, but not limitations to the material and the thickness of the barrier metal layer 202.

In a specific practice, in the production method of the display panel described above provided in embodiments of this disclosure, Step S100 described above is performed between a plurality of steps. That is, the production method provided in embodiments of this disclosure comprises at least the following implementations:
  Implementation One, as Shown in FIG. 1:
    a reductive metal compound layer is formed on the surface of the first metal layer at the side away from the base substrate, after Step S101 described above and before Step S102 described above.

Steps in implementation one are illustrated in detail below in conjunction with accompanying drawings.

S101', forming a barrier metal layer 202 on a base substrate 201, for example, forming a MoNb metal layer, as shown in FIG. 4a.

S101, forming a first metal layer 203 on the barrier metal layer 202, for example, forming a copper thin film, with reference to FIG. 4a again.

Figure 4B:
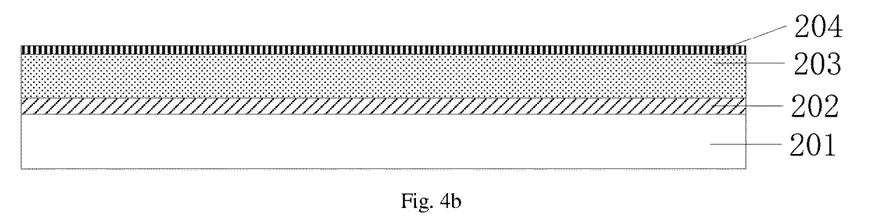
Figure 4C:
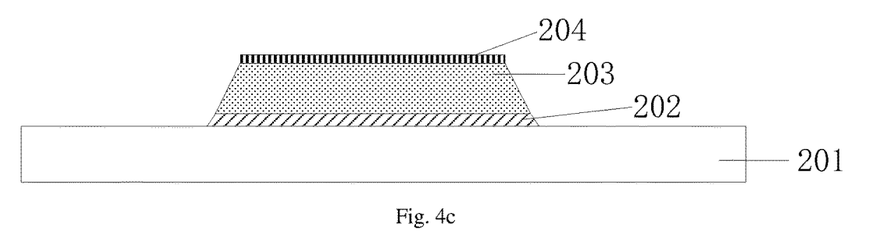
Figure 4D:
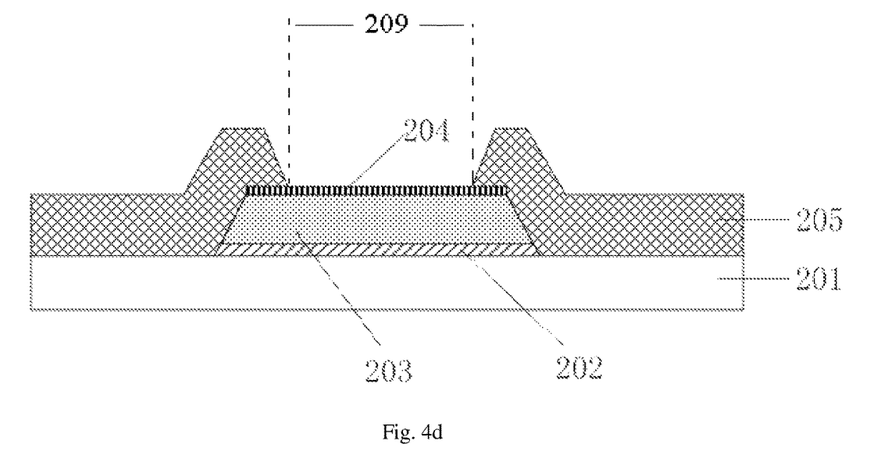
Figure 4E:
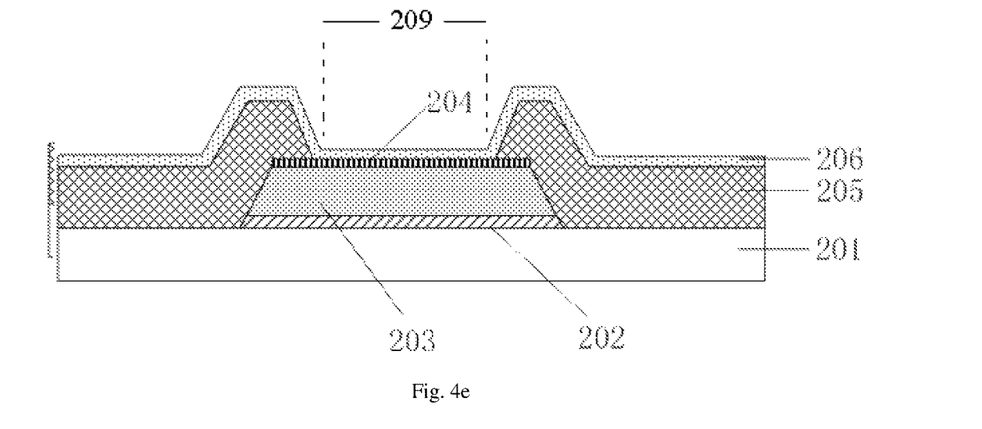
Figure 4F:
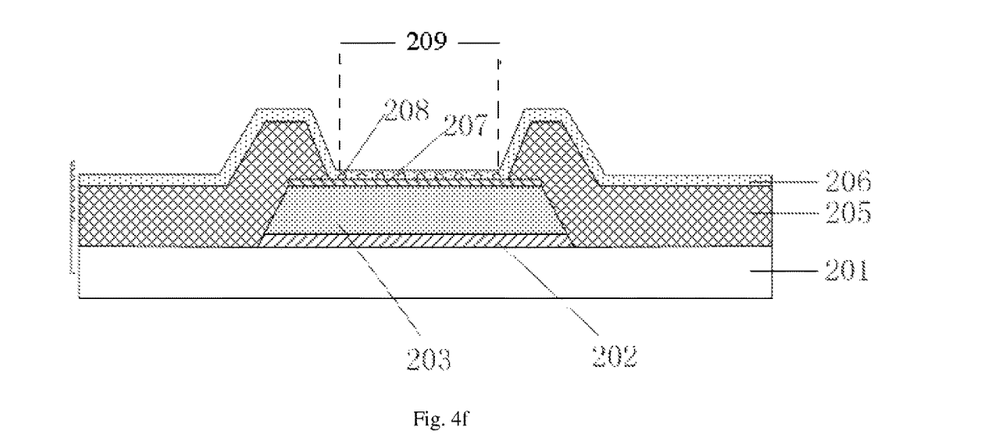

S100, forming a reductive metal compound layer 204 on the surface of the first metal layer 203, for example, forming a CuH thin film on the surface of the copper thin film in a manner of plasma surface treatment, as shown in FIG. 4b;

S102, etching the first metal layer 203, as shown in FIG. 4c. In implementation one, since the barrier metal layer 202 is formed before the first metal layer 203 is formed and the reductive metal compound layer 204 is formed after the first metal layer 203 is formed, etching the first metal layer 203 in Step S102 in implementation one refers to etching a composite metal layer formed of the barrier metal layer 202, the first metal layer 203, and the reductive metal compound layer 204, for example, etching three layers of metal thin films of CuH/Cu/MoNb together. In a specific practice, a pattern of the composite metal layer may be formed by using a one-time patterning process.

S103, forming a pattern of an insulating layer 205 on the pattern of the first metal layer 203, as shown in FIG. 4d. For example, a $Si_3N_4$ thin film may be formed and the $Si_3N_4$ thin film is etched to obtain various through holes.

S104, forming a pattern of a metal oxide conductive layer 206 on the insulating layer 205, as shown in FIG. 4e. For example, an ITO thin-film is formed, and the ITO thin-film may be electrically connected to the first metal layer 203 at the through hole.

S105, treating the reductive metal compound layer 204 and the metal oxide conductive layer 206, so that the reductive metal compound layer 204 is oxidized into a second metal layer 207 and metal particles 208 produced at the surface of the metal oxide conductive layer 206 at a side adjacent to the base substrate 201 by reduction, as shown in FIG. 4e. For example, the first metal layer 203 is a Cu thin film, the reductive metal compound layer 204 is a CuH thin film, and the metal oxide conductive layer 206 is an ITO thin-film. CuH may be decomposed into Cu and $H_2$ by heating to 60° C. to 100° C., and $In_2O_3$ in the ITO thin-film may be reduced into In by $H_2$ to form an indium ball layer. Therefore, the first metal layer 203 is not only prevented from being oxidized, but also the indium ball layer formed may improve the contact effect between the first metal layer 203 and the metal oxide conductive layer 206 to improve the signal transmission rate.

Implementation Two, as Shown in FIG. 2:
 a reductive metal compound layer is formed on the surface of the first metal layer at a side away from the base substrate, after Step S102 described above and before Step S103 described above.

Steps in implementation Two are illustrated in detail below in conjunction with accompanying drawings.

S101', forming a barrier metal layer 202 on a base substrate 201, for example, forming a MoNb metal layer, as shown in FIG. 4a.

S101, forming a first metal layer 203 on the barrier metal layer 202, for example, forming a copper thin film, with reference to FIG. 4a again.

Figure 5:
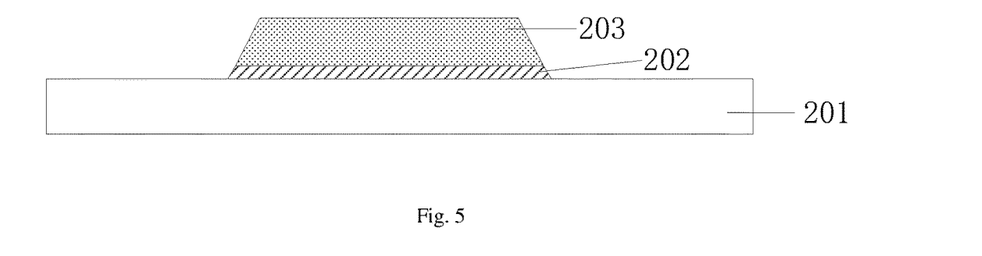

S102, etching the first metal layer 203, as shown in FIG. 5. In implementation Two, since the barrier metal layer 202 is formed before the first metal layer 203 is formed, etching the first metal layer 203 in Step S102 in implementation Two refers to etching a composite metal layer formed of the barrier metal layer 202 and the first metal layer 203, for example, etching a two layers of metal thin films of Cu/MoNb together. In a specific practice, a pattern of the composite metal layer may be formed by using a one-time patterning process.

S100, forming a reductive metal compound layer 204 on the surface of the pattern of the first metal layer 203, for example, forming a CuH thin film on the surface of the copper thin film in a manner of plasma surface treatment, as shown in FIG. 4c.

Step S103 to Step S105 in implementation Two are the same as Step S103 to Step S105 in implementation One, and repeated words are omitted herein.

Implementation Three, as Shown in FIG. 3:
 a reductive metal compound layer is formed on the surface of the first metal layer at the side away from the base substrate, after Step S103 described above and before Step S104 described above.

Steps in implementation Three are illustrated in detail below in conjunction with accompanying drawings.

S101', forming a barrier metal layer 202 on a base substrate 201, for example, forming a MoNb metal layer, as shown in FIG. 4a.

S101, forming a first metal layer 203 on the barrier metal layer 202, for example, forming a copper thin film, with reference to FIG. 4a again.

S102, etching the first metal layer 203, as shown in FIG. 5. In implementation Three, since the barrier metal layer 202 is formed before the first metal layer 203 is formed, etching the first metal layer 203 in Step S102 in implementation Three refers to etching a composite metal layer formed of the barrier metal layer 202 and the first metal layer 203, for example, etching a two layers of metal thin films of Cu/MoNb together. In a specific practice, a pattern of the composite metal layer may be formed by using a one-time patterning process.

Figure 6A:
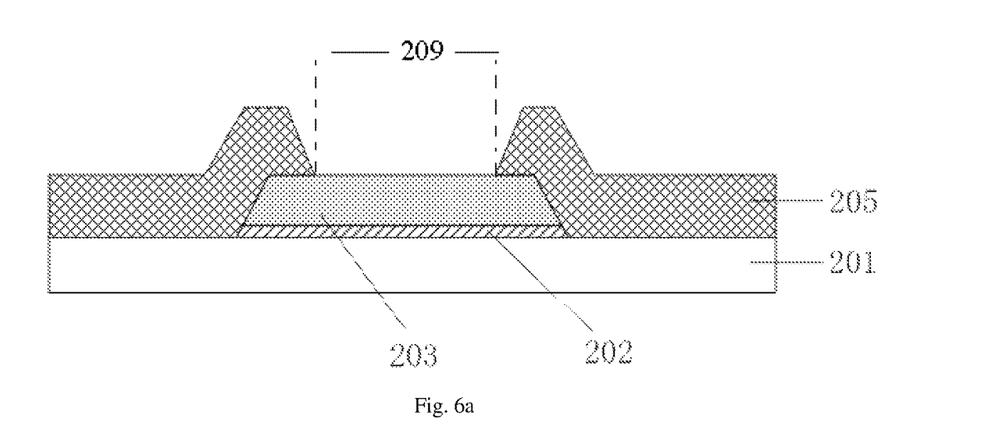

S103, forming a pattern of an insulating layer 205 on the pattern of the first metal layer 203, as shown in FIG. 6a. For example, a $Si_3N_4$ thin film may be formed and the $Si_3N_4$ thin film is etched to obtain various through holes.

Figure 6B:
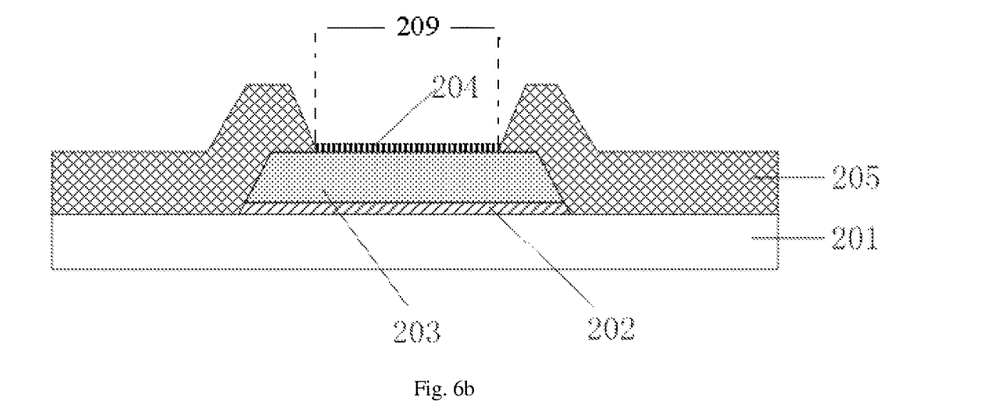

S100, forming a reductive metal compound layer 204 on the surface of the first metal layer 203, for example, forming a CuH thin film on the surface of the copper thin film in a manner of plasma surface treatment, as shown in FIG. 6b.

Figure 6C:
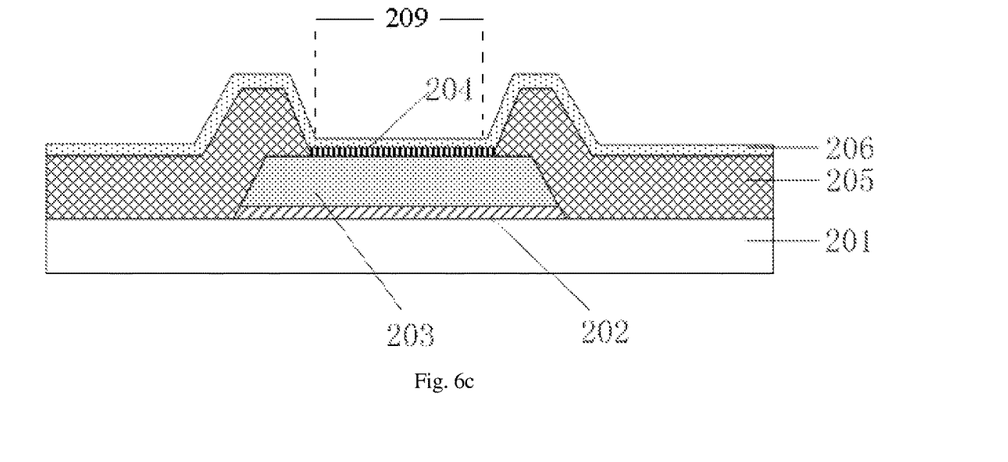

S104, forming a pattern of a metal oxide conductive layer 206 on the insulating layer 205, as shown in FIG. 6c. For example, an ITO thin-film is formed, and the ITO thin-film may be electrically connected to the first metal layer 203 at the through hole.

S105, treating the reductive metal compound layer 204 and the metal oxide conductive layer 206, so that the reductive metal compound layer 204 is oxidized into a second metal layer 207 and metal particles 208 are produced at the surface of the metal oxide conductive layer 206 at the site adjacent to the base substrate 201 by reduction, as shown in FIG. 6c. For example, the first metal layer 203 is a Cu thin film, the reductive metal compound layer 204 is a CuH thin film, and the metal oxide conductive layer 206 is an ITO thin-film. CuH may be decomposed into Cu and $H_2$ by heating to 60° C. to 100° C., and $In_2O_3$ in the ITO thin-film may be reduced into In by $H_2$ to form an indium ball layer. Therefore, the first metal layer 203 is not only prevented from being oxidized, but also the indium ball layer formed may improve the contact effect between the first metal layer 203 and the metal oxide conductive layer 206 to improve the signal transmission rate.

According to a second aspect of this disclosure, based on the same concept, an embodiment of this disclosure provides a display panel, which is produced by the production method of the display panel described above. Since this display panel has a similar principle for solving the problems to that of the production method of the display panel described above, the implementation of this display panel may be referred to the implementations of the production method of the display panel described above, and repeated words are omitted herein.

Figure 6D:
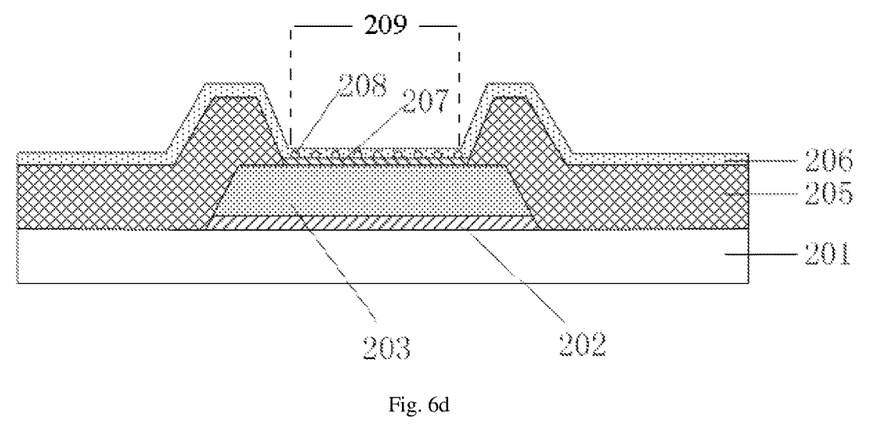

As shown in FIG. 4f and FIG. 6d, the display panel provided in embodiments of this disclosure comprises at least: a base substrate 201, a first metal layer 203 located on the base substrate 201, an insulating layer 205 located on the first metal layer 203, and a metal oxide conductive layer 206 located on the insulating layer 205; wherein
 the first metal layer 203 and the metal oxide conductive layer 206 are electrically connected by a through hole 209 in the insulating layer 205; and
 metal particles 208, which are produced at the metal oxide conductive layer 206 by reduction, are present at the surface of the metal oxide conductive layer 206 at the site adjacent to the base substrate 201.

In a specific practice, a barrier metal layer 202 may be further provided on the first metal layer 203 at a site adjacent to the base substrate 201 so as to improve the adhesion between the first metal layer 203 and a pad substrate and prevent the diffusion of metal atoms in the first metal layer 203.

In the process of production, a second metal layer 207 is further provided between the first metal layer 203 and the metal oxide conductive layer 206 if the metal materials in the first metal layer 203 and the reductive metal compound layer 204 are different.

According to a third aspect of this disclosure, based on the same concept, an embodiment of this disclosure provides a display apparatus, comprising the display panel described above. This display apparatus may be any product or member having the function of display, such as a cell phone, a tablet computer, a television, a display, a laptop, a digital photo frame, a navigator, etc. Since this display apparatus has a similar principle for solving problems to that of the display panel described above, the implementation of this display apparatus may be referred to the implementation of the display panel described above. Verbose words are omitted herein.

With respect to the display panel, the production method thereof, and the display apparatus provided in embodiments of this disclosure, by forming a reductive metal compound layer on a surface of the first metal layer at a side away from the base substrate before forming the metal oxide conductive layer, the oxidation of the first metal layer caused by being in contact with the metal oxide conductive layer may be thus prevented. Additionally, the reductive metal compound layer and the metal oxide conductive layer are treated after forming the pattern of the metal oxide conductive layer so that there is a second metal layer and metal particles from the metal oxide conductive layer by reduction between the first metal layer and the metal oxide conductive layer. Therefore, the contact resistance between the first metal layer and the metal oxide conductive layer may be greatly reduced so as to improve the display effect.

Obviously, various modifications and variations may be made to this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A production method of a display panel, comprising:
   forming a pattern of a first metal layer on a base substrate and a pattern of a metal oxide conductive layer at a side of the first metal layer away from the base substrate, the metal oxide conductive layer being electrically connected to the first metal layer by at least one through hole; wherein
   the production method further comprises steps of:
   forming a reductive metal compound layer on a surface of the first metal layer at the side away from the base substrate before forming the pattern of the metal oxide conductive layer; and
   treating the reductive metal compound layer and the metal oxide conductive layer after forming the pattern of the metal oxide conductive layer, so that the reductive metal compound layer is oxidized into a second metal layer and metal particles are produced at a surface of the metal oxide conductive layer at a side adjacent to the base substrate by reduction.

2. The production method according to claim 1, wherein said forming a reductive metal compound layer on a surface of the first metal layer at a side away from the base substrate comprises: forming a reductive metal compound layer on a surface of the first metal layer at a side away from the base substrate by a reaction between a solution of a metal salt and a reducing agent.

3. The production method according to claim 1, wherein said forming a reductive metal compound layer on a surface of the first metal layer at a side away from the base substrate comprises: performing plasma treatment using a reductive gas on the surface of the first metal layer at the side away from the base substrate.

4. The production method according to claim 3, wherein a metal material used in the first metal layer is the same as a metal material used in the second metal layer.

5. The production method according to claim 3, wherein said performing plasma treatment using a reductive gas on the surface of the first metal layer at a side away from the base substrate comprises: performing plasma treatment using one or more gases selected from $H_2$, $NH_3$, $N_2H_4$, $H_2S$, $CH_4$, $C_2H_6$ or HCN on the surface of the first metal layer at a side away from the base substrate.

6. The production method according to claim 1, wherein the reductive metal compound layer is a metal hydride layer.

7. The production method according to claim 1, wherein the reductive metal compound layer is a copper hydride layer.

8. The production method according to claim 7, wherein the copper hydride layer is formed by a reaction between a copper salt and a reducing agent.

9. The production method according to claim 1, wherein the reductive metal compound layer has a thickness of 10 nm to 20 nm.

10. The production method according to claim 1, wherein said treating the reductive metal compound layer and the metal oxide conductive layer so that the reductive metal compound layer is oxidized into a second metal layer and metal particles are produced at the surface of the metal oxide conductive layer at the side adjacent to the base substrate by reduction comprises: heating the base substrate after forming the pattern of the metal oxide conductive layer.

11. The production method according to claim 10, wherein the base substrate after forming the pattern of the metal oxide conductive layer is heated to 60° C. to 100° C.

12. The production method according to claim 1, wherein before said forming a pattern of a first metal layer on a base substrate, the production method further comprises forming a barrier metal layer on the base substrate.

13. The production method according to claim 12, wherein a material of the barrier metal layer is selected from Mo, a MoNb alloy, Ti, or a MoTi alloy.

14. The production method according to claim 12, wherein the barrier metal layer has a thickness of 20 nm to 50 nm.

15. The production method according to claim 1, wherein said forming a reductive metal compound layer on a surface of the first metal layer at a side away from the base substrate before forming the pattern of the metal oxide conductive layer comprises:
   forming a reductive metal compound layer on a surface of the first metal layer at a side away from the base substrate after forming the first metal layer and before forming the pattern of the first metal layer; or
   forming a reductive metal compound layer on a surface of the first metal layer at a side away from the base substrate after forming the pattern of the first metal layer and before forming the through hole conducting the first metal layer and the metal oxide conductive layer; or
   forming a reductive metal compound layer on a surface of the first metal layer at a side away from the base substrate after forming the through hole conducting the first metal layer and the metal oxide conductive layer and before forming the pattern of the metal oxide conductive layer.

16. The production method according to claim 1, wherein the first metal layer is a copper layer or an aluminum layer.

17. The production method according to claim 1, wherein the metal oxide conductive layer is an indium tin oxide layer.

18. The production method according to claim 1, wherein the metal oxide conductive layer has a thickness of 40 nm to 100 nm.

* * * * *